United States Patent
Abe

(10) Patent No.: US 9,515,649 B2
(45) Date of Patent: Dec. 6, 2016

(54) CASCODE CIRCUIT

(71) Applicant: Sharp Kabushiki Kaisha, Osaka-shi, Osaka (JP)

(72) Inventor: Kazuya Abe, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/385,641

(22) PCT Filed: Mar. 22, 2013

(86) PCT No.: PCT/JP2013/058241
§ 371 (c)(1),
(2) Date: Sep. 16, 2014

(87) PCT Pub. No.: WO2013/146570
PCT Pub. Date: Oct. 3, 2013

(65) Prior Publication Data
US 2015/0061752 A1    Mar. 5, 2015

(30) Foreign Application Priority Data
Mar. 27, 2012 (JP) ................................ 2012-071570

(51) Int. Cl.
*H03K 17/22* (2006.01)
*H03K 17/0812* (2006.01)
*H03K 17/10* (2006.01)

(52) U.S. Cl.
CPC ...... *H03K 17/223* (2013.01); *H03K 17/08122* (2013.01); *H03K 17/102* (2013.01)

(58) Field of Classification Search
CPC ................... H03K 17/08122; H03K 17/102; H03K 17/223; H03K 17/08116; H03K 17/08128; H03K 17/0822; H03K 17/0828
USPC ......................................................... 327/309
See application file for complete search history.

(56) References Cited

U.S. PATENT DOCUMENTS

| 6,111,454 A * | 8/2000 | Shinohe ........... H03K 17/04206 327/427 |
| 6,614,281 B1 * | 9/2003 | Baudelot ............ H03K 17/0828 327/321 |

FOREIGN PATENT DOCUMENTS

JP    2006-324839 A    11/2006

* cited by examiner

*Primary Examiner* — Lincoln Donovan
*Assistant Examiner* — Colleen Toole
(74) *Attorney, Agent, or Firm* — Birch, Stewart, Kolasch & Birch, LLP

(57) ABSTRACT

A cascode circuit (1) is provided with a switching element (Q1) which is normally off by default, a switching element (Q2) and a clamp circuit (10). A source of the switching element (Q2) is connected to a drain of the switching element (Q1). The cascode circuit (1) engages in a normally-off operation through a gate driving circuit (100) connected to a gate of the switching element (Q1). The clamp circuit (10) is provided between a power source terminal (P) of the gate driving circuit (100) and the drain of the switching element (Q1). A power source (E) is connected to the power source terminal (P). When the gate driving circuit (100) operates to turn off the switching element (Q1) and the switching element (Q2), the clamp circuit (10) clamps a voltage between the drain and the source of the switching element (Q1) to a power source voltage (V) supplied from the power source (E).

2 Claims, 6 Drawing Sheets

CASCODE CIRCUIT

TECHNICAL FIELD

The present invention relates to a cascode circuit, and in particular relates to a cascode circuit engaging in a normally-off operation.

BACKGROUND ART

The application of such a high-voltage power transistor that is made of SiC (silicon carbide), GaN (gallium nitride) and the like in a power switching unit is expanding rapidly. However, since the power transistor is generally a switching element which is normally on by default, the application of a gate driving circuit (gate driving circuit engaging in a normally-off operation), which is commonly used in the power switching unit to drive a switching element which is normally off by default, is impossible.

Thereby, in order to cause a switching element which is normally on by default to perform the normally-off operation, a cascode circuit may be configured in such a way that a drain of a normally-off switching element is connected to a source of a switching element which is normally on by default. In the case where the cascode circuit has such a configuration, when a switching element which is normally on by default is caused to perform a turn-off operation by the gate driving circuit engaging in a normally-off operation, it is possible to make it fall into an off state in the same way as a switching element which is normally off by default.

CITATION LIST

Patent Document

PTD 1: Japanese Patent Laying-Open No. 2006-324839

SUMMARY OF INVENTION

Technical Problem

FIG. 7 is a circuit diagram illustrating a circuit configuration of a conventional cascode circuit. The cascode circuit illustrated in FIG. 7 is provided with a switching element Q1 and a switching element Q2.

Switching element Q1 is an FET (Field Effect Transistor) which is normally off by default, and switching element Q2 is an FET which is normally on by default. The drain of switching element Q1 is connected to the source of switching element Q2. The source of switching element Q1 is connected to the gate of switching element Q2. The gate of switching element Q1 is connected to a gate driving circuit 100 engaging in a normally-off operation.

Gate driving circuit 100, based on a control signal sent from a signal source S, causes a gate driving element G to generate a gate driving signal engaging in a normally-off operation and output the gate driving signal to the gate of switching element Q1. Gate driving circuit 100 is supplied with a power source voltage V from a power source E through the intermediary of a power source terminal P. A resistor R is a gate resistance, and is configured to regulate the time for transferring the gate driving signal. A capacitor C is a bypass capacitor for gate driving circuit 100, and is configured to stabilize power source voltage V supplied to power source terminal P. A capacitor C0 is a capacitor for stabilizing power source E.

A connection point between the source of switching element Q1 and an external circuit (not shown) is denoted by P0, a connection point between the drain of switching element Q1 and the source of switching element Q2 is denoted by P1, and a connection point between the drain of switching element Q2 and an external circuit (not shown) is denoted by P2.

With the circuit configuration as described above, as the cascode circuit is caused to perform a turn-off operation by gate driving circuit 100 engaging in a normally-off operation, it can keep switching element Q2 which is normally on by default at an off state. Hereinafter, the turn-off operation of the cascode circuit illustrated in FIG. 7 will be described with reference to FIG. 8.

FIG. 8 is a waveform diagram illustrating temporal variations of a gate-source voltage and a drain-source voltage of each switching element included in the cascode circuit of FIG. 7 in a turn-off operation. A waveform 8a denotes a gate-source voltage Vgs1 of switching element Q1, a waveform 8b denotes a drain-source voltage Vds1 of switching element Q1, a waveform 8c denotes a gate-source voltage Vgs2 of switching element Q2, and a waveform 8d denotes a drain-source voltage Vds2 of switching element Q2.

Since initially both switching element Q1 and switching element Q2 are at the on state, both drain-source voltage Vds1 of switching element Q1 and drain-source voltage Vds2 of switching element Q2 are equal to zero.

At a timing t1, as a gate driving signal for causing the cascode circuit to perform the turn-off operation is input from gate driving circuit 100 to the gate of switching element Q1, gate-source voltage Vgs1 of switching element Q1 drops from power source voltage V to zero. However, switching element Q1 will not be switched from the on state to the off state immediately after the initiation of the turn-off operation but will be switched from the on state to the off state after a delay time of $\Delta t1$. At a timing $(t1+\Delta t1)$, as the switching of switching element Q1 from the on state to the off state is initiated, drain-source voltage Vds1 of switching element Q1 begins to increase. As drain-source voltage Vds1 of switching element Q1 increases, the voltage applied to the source of switching element Q2 which is normally on by default also increases, and thereby, gate-source voltage Vgs2 of switching element Q2 becomes a negative voltage. Both the magnitude of drain-source voltage Vds1 of switching element Q1 and the magnitude of gate-source voltage Vgs2 are equal to a potential difference between connection point P0 and connection point P1, but the direction of each voltage is opposite to each other in positive or negative polarity. Therefore, the negative voltage applied to gate-source voltage Vgs2 increases. As it reaches a gate threshold voltage Vth2 of switching element Q2, switching element Q2 starts to perform the turn-off operation.

At a timing t2, as gate-source voltage Vgs2 of switching element Q2 reaches gate threshold voltage Vth2 of switching element Q2, switching element Q2 starts to perform the turn-off operation, and however, it will not initiate the switching from the on state to the off state instantly. Switching element Q2 initiates the switching from the on state to the off state after a delay time of $\Delta t2$ after the initiation of the turn-off operation. During the interval from timing $(t1+\Delta t1)$ to timing $(t2+\Delta t2)$, since switching element Q2 is still at the on state, the potential of connection point P1 is equal to the potential of connection point P2. Therefore, the increment of drain-source voltage Vds1 of switching element Q1 is equal to the increase of the potential of connection point P2.

At a timing (t2+Δt2), as switching element Q2 initiates the switching from the on state to the off state, drain-source voltage Vds2 of switching element Q2 begins to increase. And thereby, the potential of connection point P2 continues to rise. Starting from timing (t2+Δt2), drain-source voltage Vds1 of switching element Q1 and drain-source voltage Vds2 of switching element Q2 become equal to a partial voltage divided from the potential difference between connection point P0 and connection point P2 according to a ratio between the parasitic capacitance of the drain-source voltage of switching element Q1 and the parasitic capacitance of the drain-source voltage of switching element Q2. Therefore, drain-source voltage Vds1 of switching element Q1 continues to increase as well.

At a timing t3, switching element Q1 and switching element Q2 end the turn-off operation, and both fall into the off state. At this time, both drain-source voltage Vds1 of switching element Q1 and drain-source voltage Vds2 of switching element Q2 are equal to a partial voltage divided from the potential difference between connection point P0 and connection point P2 according to a ratio between the parasitic capacitance of the drain-source voltage of switching element Q1 and the parasitic capacitance of the drain-source voltage of switching element Q2.

Since the withstand voltage required by switching element Q1 is comparable to power source voltage V, a low-withstand voltage switching element is used as switching element Q1. The reason therefor is that it is known that a switching element such as FET with a low withstand voltage has a smaller on-resistance, and thereby it is possible to reduce conduction loss. However, in the case where an external circuit requiring a high voltage is connected to the cascode circuit, it is necessary to use a high-withstand voltage switching element as switching element Q2 which is normally on by default.

As described above, since both drain-source voltage Vds1 of switching element Q1 and drain-source voltage Vds2 of switching element Q2 are equal to the partial voltage divided from the potential difference between connection point P0 and connection point P2, depending on the ratio of the parasitic capacitance, a high voltage may be applied to between the drain and the source of switching element Q1. Therefore, if switching element Q1 has a low withstand voltage, drain-source voltage Vds1 of switching element Q1 may exceed the withstand voltage and damage switching element Q1.

In order to solve the above problem, PTD 1 discloses in detail two circuits in the following.

A first circuit is structured in such a way that a zener diode configured to clamp a voltage is connected between the drain and the source of a switching element which is normally off by default in parallel to the switching element in such a way that the cathode of the zener diode is connected to the drain of the switching element. According to the first circuit, since the voltage between the drain and the source is equal to or lower than the breakdown voltage of the zener diode, the switching element can be prevented from being damaged. However, when the voltage between the drain and the source exceeds the breakdown voltage, the energy which would otherwise be used to increase the voltage will be dissipated as the power loss because of the breakdown of the zener diode. As a result, the power conversion efficiency will be deteriorated, and the long-term reliability of the zener diode will be adversely affected as well.

A second circuit is structured in such a way that a capacitor configured to moderately increase a voltage is connected between the drain and the source of a switching element which is normally off by default in parallel to the switching element. Through adjusting the ratio of the parasitic capacitance using the capacitor connected in parallel, it is possible for the second circuit to prevent the switching element from being damaged. However, the energy being stored in the capacitor during the turn-off operation will be released in a subsequent turn-on operation and will be dissipated as the power loss eventually. Although it is possible to regenerate the energy stored in the capacitor by adding a soft switching circuit, it will increase the manufacture cost and make the control complicated, and thereby it is not practical.

The present invention has been accomplished in view of the aforementioned problems, and it is therefore an objective of the present invention to provide a cascode circuit capable of preventing a switching element which is normally off by default from being damaged in a turn-off operation and reducing a power loss.

Solution to Problem

To attain the object describe above, a cascode circuit according to an aspect of the present invention includes a first switching element which is normally off by default and a second switching element having a source of the second switching element connected to a drain of the first switching element, and is caused to perform a normally-off operation by a gate driving circuit connected to a gate of the first switching element. The cascode circuit further includes a clamp circuit which is provided between a power source terminal of the gate driving circuit and the drain of the first switching element. A power source is connected the power source terminal. The clamp circuit is configured to clamp a voltage between the drain and the source of the switching element to a power source voltage supplied from the power source when the gate driving circuit operates to turn off the first switching element and the second switching element.

Preferably, the second switching element is normally on by default and a gate of the second switching element being connected to the source of the first switching element, and the clamp circuit includes a first diode connected in series between the drain of the first switching element and the power source terminal in such a way that an anode of the first diode is connected to the drain of the first switching element.

Preferably, the second switching element is normally off by default and a gate of the second switching element being configured to receive the power source voltage supplied from the power source, and the clamp circuit includes a first diode connected in series between the drain of the first switching element and the power source terminal in such a way that an anode of the first diode is connected to the drain of the first switching element.

Preferably, the clamp circuit further includes a capacitor connected between a cathode of the first diode and the source of the first switching element, and a resistor connected between the cathode of the first diode and the power source terminal of the gate driving circuit.

Preferably, the clamp circuit further includes a capacitor connected between a cathode of the first diode and a source of the first switching element, an inductor connected between the cathode of the first diode and the power source terminal of the gate driving circuit, and a second diode connected in series between the power source and the power source terminal in such a way that a cathode of the second diode is connected to the power source terminal.

Advantageous Effects of Invention

The cascode circuit according to the present invention is provided with a clamp circuit to suppress the voltage between the drain and the source of the first switching element equal to or lower than the power source voltage supplied to the power source terminal of the gate driving circuit. Since the power source voltage of the gate driving circuit is the same as the voltage supplied to the gate for driving the first switching element, it is set less than the gate-source withstand voltage of the first switching element. Thereby, the power source voltage of the gate driving circuit is less than the gate-source withstand voltage. Thus, the drain-source voltage of the first switching element is suppressed less than the gate-source withstand voltage, making it possible to prevent the first switching element from being damaged. Moreover, the power loss of the cascode circuit is equal to only the energy consumed in the clamp circuit when the drain voltage of the first switching element exceeds the power source voltage of the gate driving circuit, compared to a conventional cascode circuit, it is possible for the cascode circuit of the present invention to reduce the power loss. Consequently, it is possible to achieve a cascode circuit capable of preventing the first switching element from being damaged in a turn-off operation and reducing the power loss.

DESCRIPTION OF EMBODIMENTS

Hereinafter, a cascode circuit according to a first embodiment will be described with reference to FIGS. 1 and 2.

First Embodiment

Figure 1:
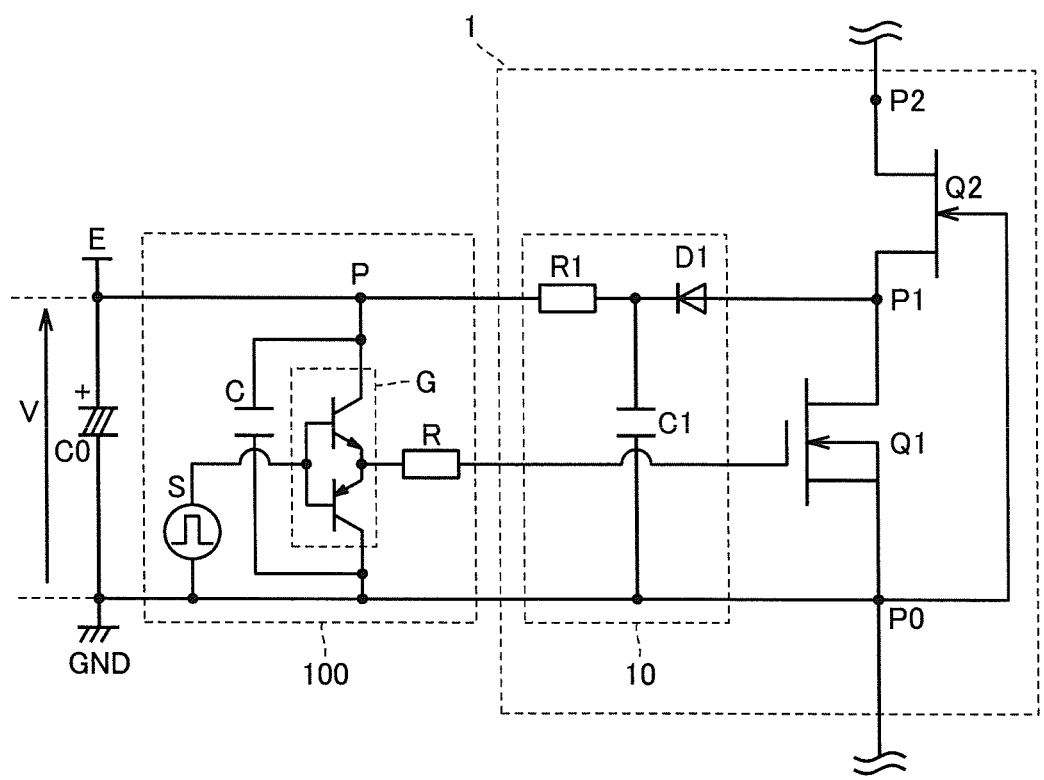
FIG. 1 is a circuit diagram illustrating a circuit configuration of a cascode circuit according to a first embodiment of the present invention.

FIG. 1 is a circuit diagram illustrating a circuit configuration of a cascode circuit 1 according to the first embodiment of the present invention. Cascode circuit 1 illustrated in FIG. 1 includes a switching element Q1, a switching element Q2 and a clamp circuit 10.

Switching element Q1 (first switching element) is an FET which is normally off by default, and switching element Q2 (second switching element) is a power transistor which is normally on by default. The drain of switching element Q1 is connected to the source of switching element Q2. The source of switching element Q1 is connected to the gate of switching element Q2. The gate of switching element Q1 is connected to a gate driving circuit 100 engaging in a normally-off operation.

Gate driving circuit 100, based on a control signal sent from a signal source S, causes a gate driving element G to generate a gate driving signal engaging in a normally-off operation and output the gate driving signal to the gate of switching element Q1. Gate driving circuit 100 is supplied with a power source voltage V from a power source E through the intermediary of a power source terminal P. A resistor R is a gate resistance, and is configured to regulate the time for transferring the gate driving signal. A capacitor C is a bypass capacitor for gate driving circuit 100, and is configured to stabilize power source voltage V supplied to power source terminal P. A capacitor C0 is a capacitor for stabilizing power source E.

Clamp circuit 10 includes a diode D1, a capacitor C1 and a resistor R1. Diode D1 (first diode) is connected in series between the drain of switching element Q1 and power source terminal P in such a way that an anode thereof is connected to the drain of switching element Q1. Capacitor C1 is connected between the cathode of diode D1 and the source of switching element Q1. Resistor R1 is a discharge resistor connected in series between the cathode of diode D1 and power source terminal P for discharging excess charge in capacitor C1.

A connection point between the source of switching element Q1 and an external circuit (not shown) is denoted by P0, a connection point between the drain of switching element Q1 and the source of switching element Q2 is denoted by P1, and a connection point between the drain of switching element Q2 and an external circuit (not shown) is denoted by P2.

Hereinafter, the turn-off operation of cascode circuit 1 will be described with reference to FIG. 2.

Figure 2:
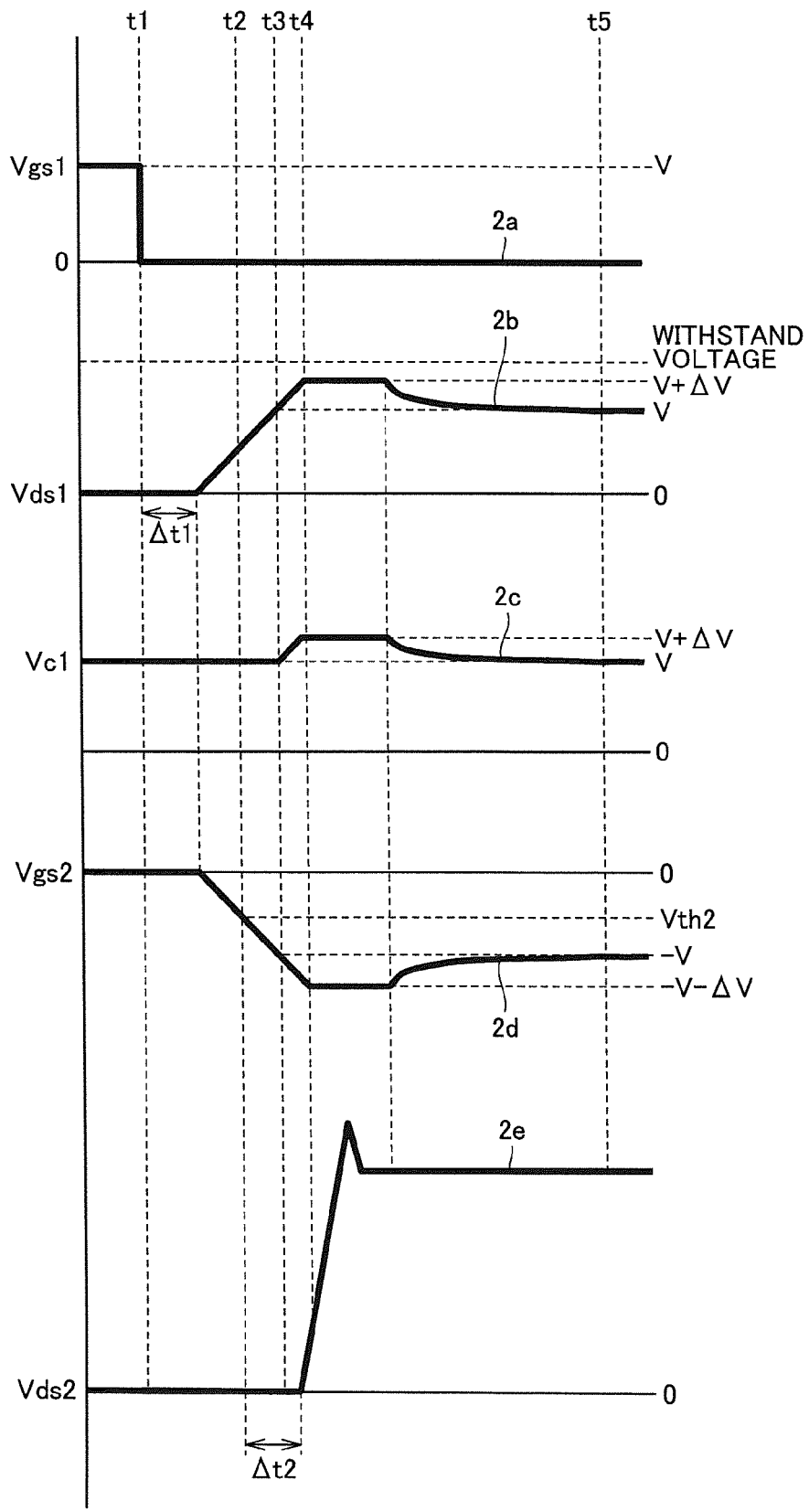
FIG. 2 is a waveform diagram illustrating temporal variations of a gate-source voltage and a drain-source voltage of each switching element included in the cascode circuit of FIG. 1 in a turn-off operation.

FIG. 2 is a waveform diagram illustrating temporal variations of a gate-source voltage and a drain-source voltage of each switching element included in cascode circuit 1 of FIG. 1 in the turn-off operation. A waveform 2a denotes a gate-source voltage Vgs1 of switching element Q1, a waveform 2b denotes a drain-source voltage Vds1 of switching element Q1, a waveform 2c denotes a terminal-terminal voltage Vc1 of capacitor C1, a waveform 2d denotes a gate-source voltage Vgs2 of switching element Q2, and a waveform 2e denotes a drain-source voltage Vds2 of switching element Q2.

Since initially both switching element Q1 and switching element Q2 are at the on state, both drain-source voltage Vds1 of switching element Q1 and drain-source voltage Vds2 of switching element Q2 are equal to zero. Capacitor C1 is charged at power source voltage V.

At a timing t1, as a gate driving signal for causing cascode circuit 1 to perform the turn-off operation is input from gate driving circuit 100 to the gate of switching element Q1, gate-source voltage Vgs1 of switching element Q1 drops from power source voltage V to zero. However, switching element Q1 will not be switched from the on state to the off state immediately after the initiation of the turn-off operation but will be switched from the on state to the off state after a delay time of $\Delta t1$.

At a timing ($t1+\Delta t1$), as the switching of switching element Q1 from the on state to the off state is initiated, drain-source voltage Vds1 of switching element Q1 begins to increase. As drain-source voltage Vds1 of switching element Q1 increases, the voltage applied to the source of switching element Q2 which is normally on by default also increases, and thereby, gate-source voltage Vgs2 of switching element Q2 becomes a negative voltage. Both the magnitude of drain-source voltage Vds1 of switching element Q1 and the magnitude of gate-source voltage Vgs2 are equal to a potential difference between connection point P0 and connection point P1, but the direction of each voltage is opposite to each other in positive and negative polarity. Therefore, the negative voltage applied to gate-source voltage Vgs2 increases. As gate-source voltage Vgs2 of switching element Q2 reaches a gate threshold voltage Vth2 of switching element Q2, switching element Q2 starts to perform the turn-off operation.

At a timing t2, as gate-source voltage Vgs2 of switching element Q2 reaches gate threshold voltage Vth2 of switching element Q2, switching element Q2 starts to perform the turn-off operation, and however, it will not initiate the switching from the on state to the off state instantly. Switching element Q2 initiates the switching from the on state to the off state after a delay time of $\Delta t2$ after the initiation of the turn-off operation. During the interval from timing ($t1+\Delta t1$) to timing ($t2+\Delta t2$), since switching element Q2 is still at the on state, the potential of connection point P1 is equal to the potential of connection point P2. Therefore, the increment of drain-source voltage Vds1 of switching element Q1 is equal to the increase of the potential of connection point P2.

At a timing t3, drain-source voltage Vds1 of switching element Q1 is increased equal to power source voltage V supplied to power source terminal P of gate driving circuit 100. Prior to timing t3, due to the rectification function of diode D1, a current has been flowing in a path from connection point P2 to connection point P1 and finally to connection point P0. However, starting from timing t3, the potential of connection point P1 is clamped to power source voltage V by clamp circuit 10, and thereby, a current flows through another path from connection point P2 to connection point P1 to diode D1 and finally to capacitor C1.

At timing ($t2+\Delta t2$), as switching element Q2 initiates the switching from the on state to the off state, drain-source voltage Vds2 of switching element Q2 begins to increase.

At a timing t4, due to the current flowing through another path, drain-source voltage Vds1 of switching element Q1 and terminal-terminal voltage Vc1 of capacitor C1 exceed power source voltage V by a voltage of $\Delta V$. Since capacitor C1 has a capacitance greater in several orders of magnitude than the parasitic capacitance between the drain and the source of switching element Q1, the voltage of $\Delta V$ is a small voltage compared to power source voltage V. Therefore, drain-source voltage Vds1 of switching element Q1 is prevented from exceeding power source voltage V excessively.

At a timing t5, switching element Q1 and switching element Q2 has completed the turn-off operation, and both are at the off state. Since resistor R1 dissipates the energy stored in capacitor C1 and equivalent to the voltage of $\Delta V$ in accordance with a time constant (R1×C1), drain-source voltage Vds1 of switching element Q1 converges to power source voltage V, and terminal-terminal voltage Vc1 of capacitor C1 is restored to power source voltage V again.

In cascode circuit 1 engaging in the turn-off operation as described above, since the voltage of the gate driving signal is equal to power source voltage V at most, the gate-source withstand voltage of switching element Q1 is defined higher than power source voltage V. Since the gate-source withstand voltage of switching element Q1 is principally greater than the gate-source withstand voltage thereof, the gate-source withstand voltage is greater than power source voltage V. Thereby, if the drain voltage of switching element Q1 is clamped not greater than power source voltage V, drain-source voltage Vds1 of switching element Q1 can be suppressed smaller than the drain-source withstand voltage, preventing switching element Q1 from being damaged.

Further, in cascode circuit 1, only the energy (energy equivalent to the voltage of $\Delta V$) when the drain voltage of switching element Q1 exceeds power source voltage V is dissipated by resistor R1 as heat. While in the conventional cascode circuit disclosed in PTD 1, the entire energy equivalent to the voltage exceeding the breakdown voltage of the zener diode, in other words, the entire energy being stored in the capacitor will be dissipated as the power loss. Therefore, it is possible to reduce the power loss in cascode circuit 1 than in the conventional cascode circuit.

Thus, according to the first embodiment, it is possible to achieve a cascode circuit capable of preventing switching element Q1 from being damaged in a turn-off operation and reducing the power loss.

Second Embodiment

The power loss can be further reduced through modifying clamp circuit 10 for clamping the drain voltage of switching element Q1. Hereinafter, a cascode circuit according to a second embodiment will be described with reference to FIG. 3.

Figure 3:
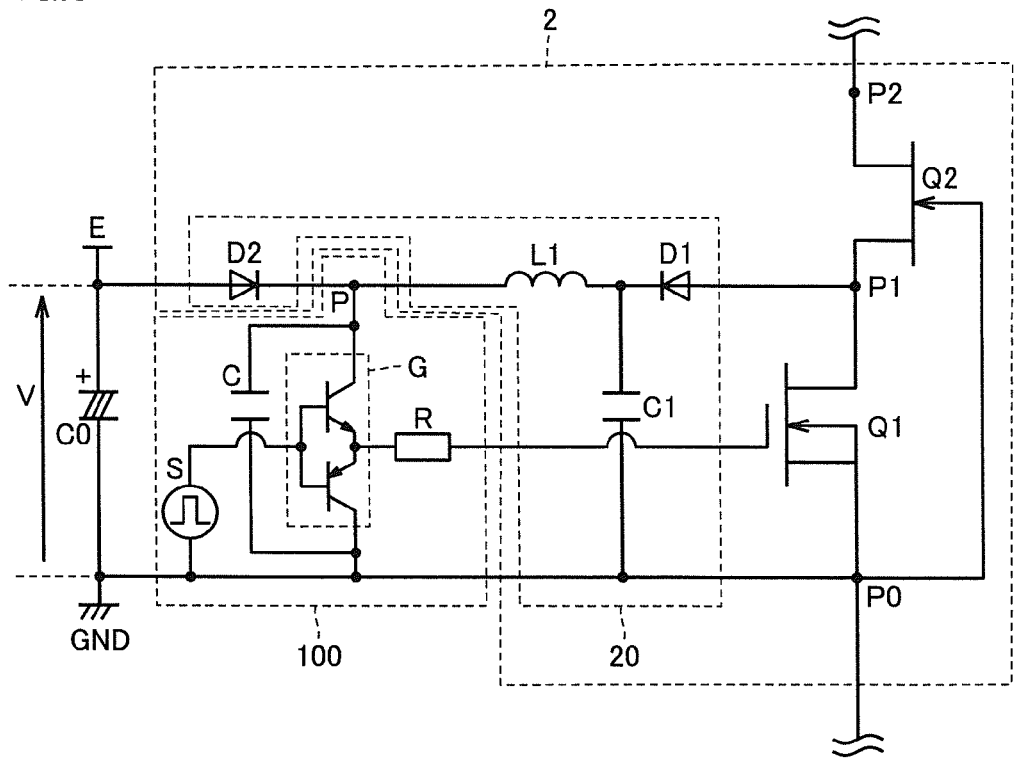
FIG. 3 is a circuit diagram illustrating a circuit configuration of a cascode circuit according to a second embodiment of the present invention.

FIG. 3 is a circuit diagram illustrating a circuit configuration of a cascode circuit 2 according to the second embodiment of the present invention. Cascode circuit 2 illustrated in FIG. 3 is different from cascode circuit 1 according to the first embodiment in that cascode circuit 2 includes a clamp circuit 20. The components that are equivalent to those cascode circuit 1 will be assigned with the same reference numerals and the detailed description thereof will not be repeated.

Clamp circuit 20 includes diode D1, capacitor C1, a diode D2. Diode D1 (first diode) is connected in series between the drain of switching element Q1 and power source terminal P in such a way that an anode thereof is connected to the drain of switching element Q1. Capacitor C1 is connected between the cathode of diode D1 and the source of switching element Q1. An inductor L1 is connected in series between the cathode of diode D1 and power source terminal P. Diode D2 (second diode) is connected in series between power source E and power source terminal P in such a way that a cathode thereof is connected to power source terminal P.

During the turn-off operation of cascode circuit 2, the temporal variations of the drain-source voltage or the like of each switching element are similar to those illustrated in FIG. 2, and thereby will be described with reference to FIG. 2 again. Since the timing where switching element Q2 starts the switching from the on state to the off state is the same as that in the first embodiment until timing ($t2+\Delta t2$), the detailed description thereof will not be repeated.

At timing t4, due to the current flowing through another path, drain-source voltage Vds1 of switching element Q1 and terminal-terminal voltage Vc1 of capacitor C1 exceed power source voltage V by the voltage of $\Delta V$. Since capacitor C1 has a capacitance greater in several orders of magnitude than the parasitic capacitance between the drain and the source of switching element Q1, the voltage of ΔV is a small voltage compared to power source voltage V. The energy equivalent to the voltage of ΔV is temporarily stored in inductor L1, and then supplied to gate driving circuit 100. Diode D2 prevents the energy equivalent to the voltage of ΔV from flowing back to power source E.

At this time, drain-source voltage Vds1 of switching element Q1 and terminal-terminal voltage Vc1 of capacitor C1 are clamped not greater than the voltage of (V+ΔV). Therefore, drain-source voltage Vds1 of switching element Q1 is prevented from exceeding power source voltage V of gate driving circuit 100 excessively.

At a timing t5, switching element Q1 and switching element Q2 has completed the turn-off operation, and both are at the off state. Drain-source voltage Vds1 of switching element Q1 converges to power source voltage V, and terminal-terminal voltage Vc1 of capacitor C1 is restored to power source voltage V again.

As described above, similar to the first embodiment, it is possible for the second embodiment to prevent switching element Q1 from being damaged in a turn-off operation. Moreover, since the energy equivalent to the voltage of ΔV is supplied to gate driving circuit 100 for its operation, there may be no power loss as that dissipated by resistor R1 as heat in the first embodiment. Therefore, the power loss can be further reduced.

Third Embodiment

In the first embodiment and the second embodiment, switching element Q2 is described as a switching element which is normally on by default, however even in the case where switching element Q2 is a switching element which is normally off by default, the present invention is still applicable. Hereinafter, a cascode circuit according to a third embodiment will be described with reference to FIGS. 4 and 5.

Figure 4:
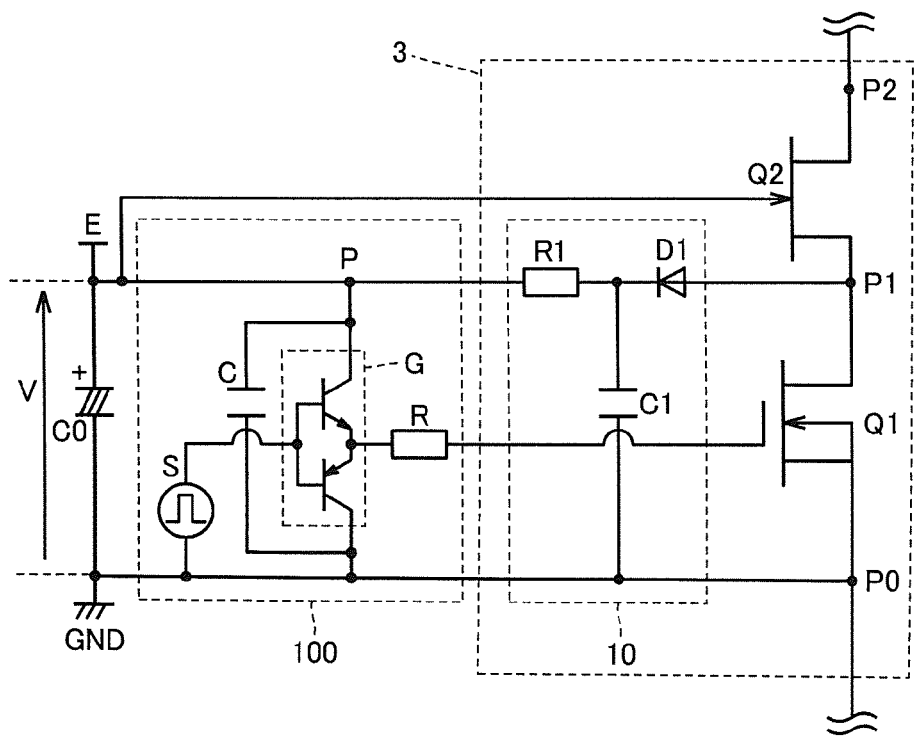
FIG. 4 is a circuit diagram illustrating a circuit configuration of a cascode circuit according to a third embodiment of the present invention.

FIG. 4 is a circuit diagram illustrating a circuit configuration of a cascode circuit 3 according to the third embodiment of the present invention. Cascode circuit 3 illustrated in FIG. 4 is different from cascode circuit 1 according to the first embodiment in that switching element Q2 is a power transistor which is normally off by default and in that power source voltage V is supplied to the gate of switching element Q2 because the power transistor is normally off. Clamp circuit 10 is equivalent to that included in cascode circuit 1. The components that are equivalent to those cascode circuit 1 will be assigned with the same reference numerals and the detailed description thereof will not be repeated.

Hereinafter, the turn-off operation of cascode circuit 3 will be described with reference to FIG. 5.

Figure 5:
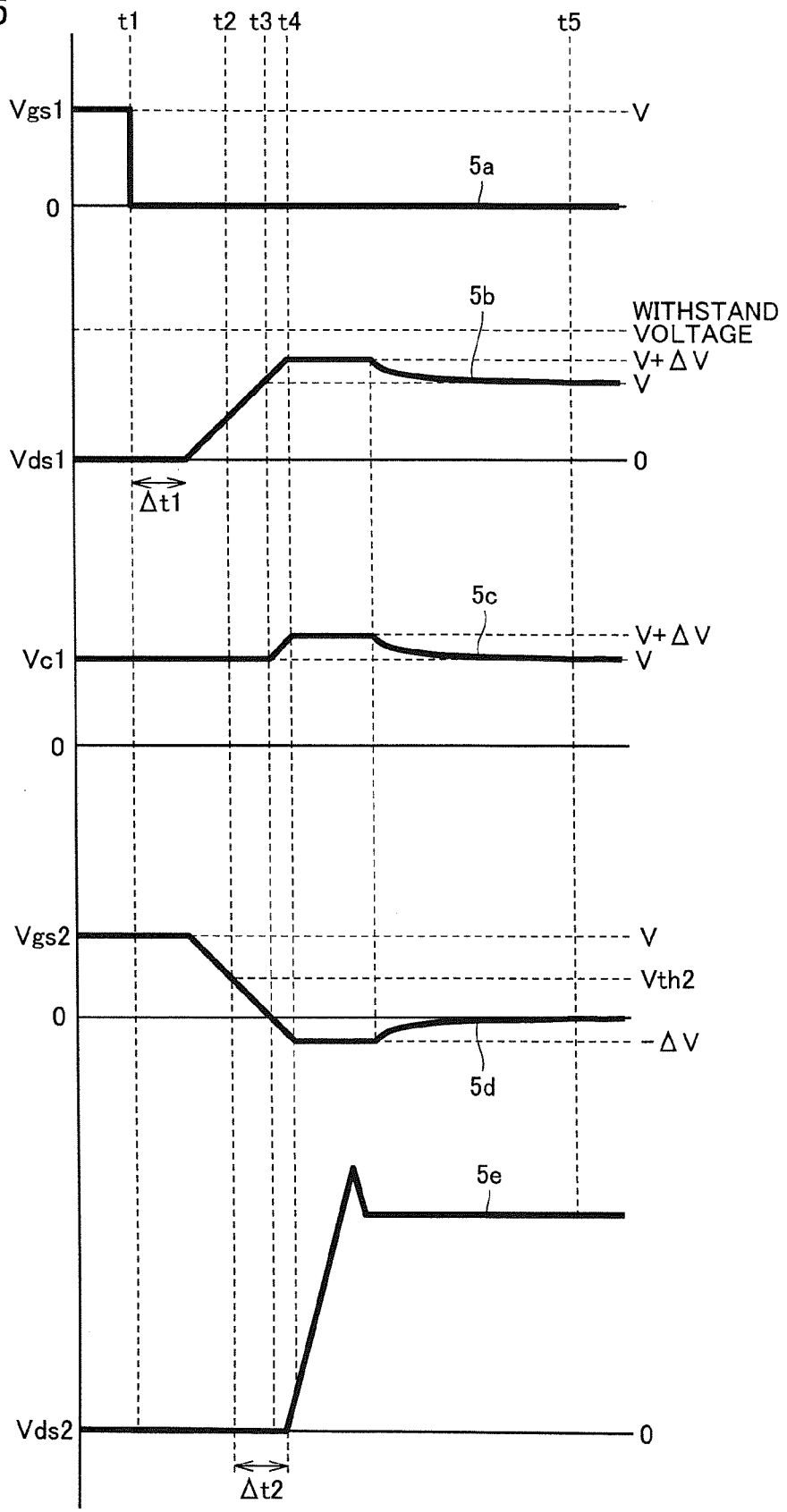
FIG. 5 is a waveform diagram illustrating temporal variations of a gate-source voltage and a drain-source voltage of each switching element included in the cascode circuit of FIG. 4 in a turn-off operation.

FIG. 5 is a waveform diagram illustrating temporal variations of a gate-source voltage and a drain-source voltage of each switching element included in cascode circuit 3 of FIG. 4 in the turn-off operation. A waveform 5a denotes a gate-source voltage Vgs1 of switching element Q1, a waveform 5b denotes a drain-source voltage Vds1 of switching element Q1, a waveform 5c denotes a terminal-terminal voltage Vc1 of capacitor C1, a waveform 5d denotes a gate-source voltage Vgs2 of switching element Q2, and a waveform 5e denotes a drain-source voltage Vds2 of switching element Q2.

Since initially gate-source voltage Vgs2 of switching element Q2 which is normally on by default is equal to power source voltage V, and both switching element Q1 and switching element Q2 are both at the on state. Both gate-source voltage Vgs1 of switching element Q1 and are equal to zero.

At timing t1, as a gate driving signal for causing cascode circuit 3 to perform the turn-off operation is input from gate driving circuit 100 to the gate of switching element Q1, gate-source voltage Vgs1 of switching element Q1 drops from power source voltage V to zero. However, switching element Q1 will not be switched from the on state to the off state immediately after the initiation of the turn-off operation but will be switched from the on state to the off state after a delay time of Δt1.

At time (t1+Δt1), as the switching of switching element Q1 from the on state to the off state is initiated, drain-source voltage Vds1 of switching element Q1 begins to increase. Since gate-source voltage Vgs2 of switching element Q2 is equal to a difference between power source voltage V and drain-source voltage Vds1 of switching element Q1 (Vgs2=V−Vds1), as drain-source voltage Vds1 of switching element Q1 increases, gate-source voltage Vgs2 of switching element Q2 will decrease at the same amount accordingly. Since switching element Q2 is normally off by default, gate threshold voltage Vth2 of switching element Q2 is a positive voltage. As gate-source voltage Vgs2 of switching element Q2 decreases and reaches gate threshold voltage Vth2 of switching element Q2, switching element Q2 initiates the turn-off operation.

At timing t2, as gate-source voltage Vgs2 of switching element Q2 reaches gate threshold voltage Vth2 of switching element Q2, switching element Q2 starts to perform the turn-off operation, and however, it will not initiate the switching from the on state to the off state instantly. Switching element Q2 initiates the switching from the on state to the off state after a delay time of Δt2 after the initiation of the turn-off operation. During the interval from timing (t1+Δt1) to timing (t2+Δt2), since switching element Q2 is still at the on state, the potential of connection point P1 is equal to the potential of connection point P2. Therefore, the increment of drain-source voltage Vds1 of switching element Q1 is equal to the increase of the potential of connection point P2.

At timing t3, drain-source voltage Vds1 of switching element Q1 is increased equal to power source voltage V supplied to power source terminal P of gate driving circuit 100. Prior to timing t3, due to the rectification function of diode D1, a current has been flowing in a path from connection point P2 to connection point P1 and finally to connection point P0. However, starting from timing t3, the potential of connection point P1 is clamped to power source voltage V by clamp circuit 10, and thereby, a current flows through another path from connection point P2 to connection point P1 to diode D1 and finally to capacitor C1.

At timing (t2+Δt2), as switching element Q2 initiates the switching from the on state to the off state, drain-source voltage Vds2 of switching element Q2 begins to increase.

At timing t4, due to the current flowing through another path, drain-source voltage Vds1 of switching element Q1 exceeds power source voltage V only by the voltage of ΔV. Accordingly, gate-source voltage Vgs2 of switching element Q2 increase from zero in the negative direction by the voltage of ΔV. Since capacitor C1 has a capacitance greater in several orders of magnitude than the parasitic capacitance between the drain and the source of switching element Q1, the voltage of ΔV is a small voltage compared to power source voltage V. Therefore, drain-source voltage Vds1 of switching element Q1 is prevented from exceeding power source voltage V excessively.

At timing t5, switching element Q1 and switching element Q2 has completed the turn-off operation, and both are at the off state. Since resistor R1 dissipates the energy stored in capacitor C1 and equivalent to the voltage of ΔV in accordance with a time constant (R1×C1), drain-source voltage Vds1 of switching element Q1 and terminal-terminal voltage Vc1 of capacitor C1 converge to power source voltage V, and gate-source voltage Vgs2 of switching element Q2 converges to zero.

As described above, even in the case where each of switching element Q1 and switching element Q2 is a switching element which is normally off by default, similar to the first embodiment, it is possible to achieve a cascode circuit capable of preventing switching element Q1 from being damaged during a turn-off operation and reducing the power loss.

Fourth Embodiment

Similar to the modification of the second embodiment relative to the first embodiment, it is possible to further reduce the power loss in the third embodiment by modifying the circuit configuration of the clamp circuit. Hereinafter, a cascode circuit according to a fourth embodiment will be described with reference to FIG. 6.

Figure 6:
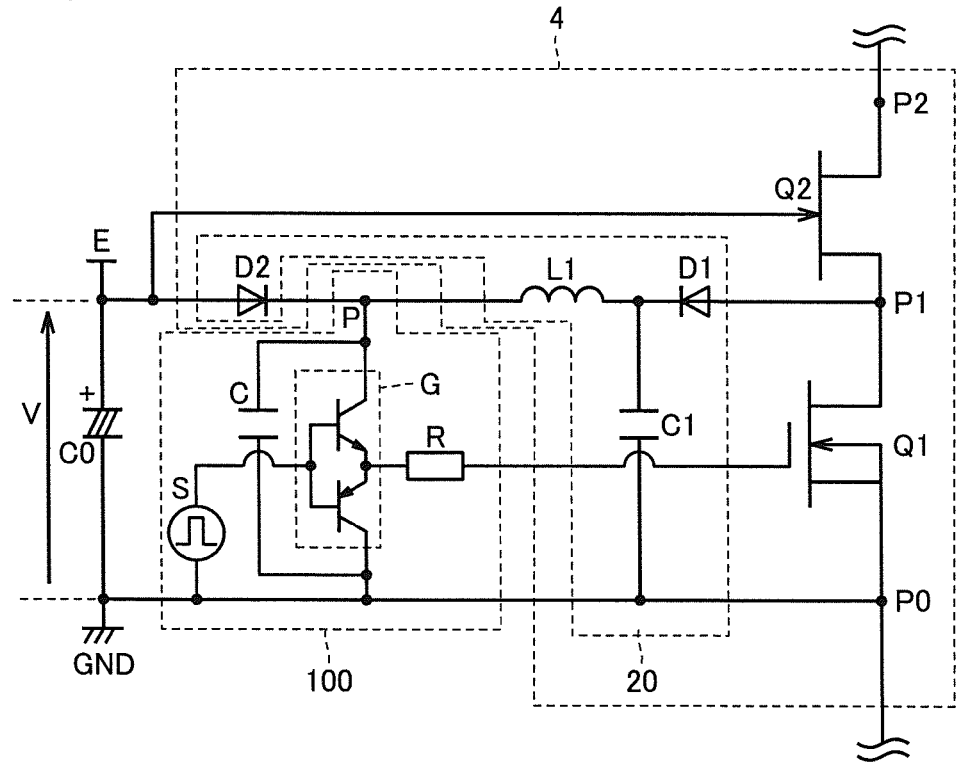
FIG. 6 is a circuit diagram illustrating a circuit configuration of a cascode circuit according to a fourth embodiment of the present invention.
Figure 7:
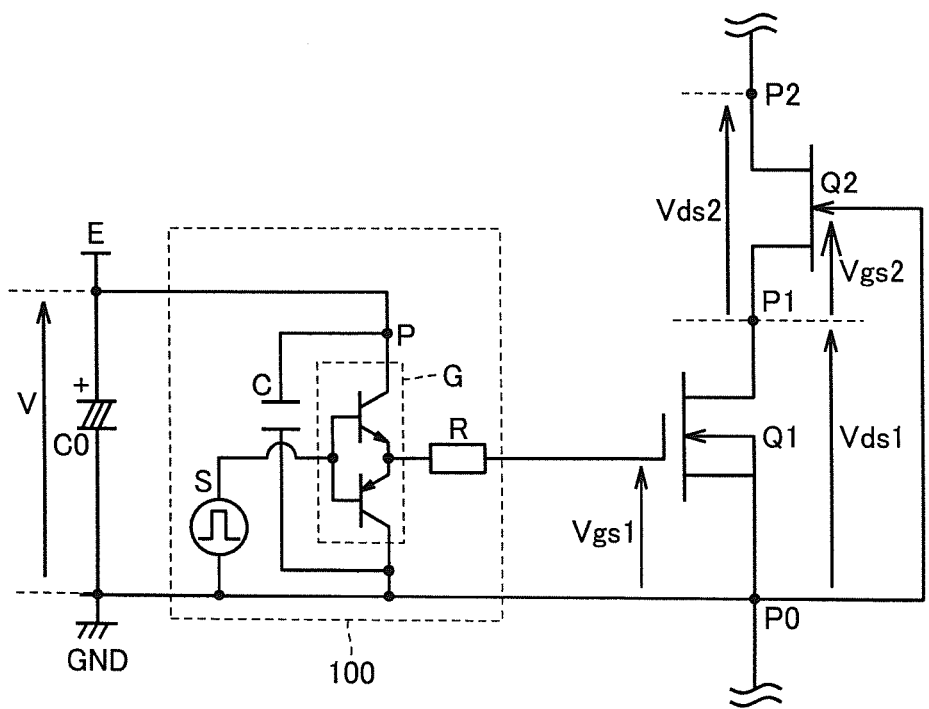
FIG. 7 is a circuit diagram illustrating a circuit configuration of a conventional cascode circuit.
Figure 8:
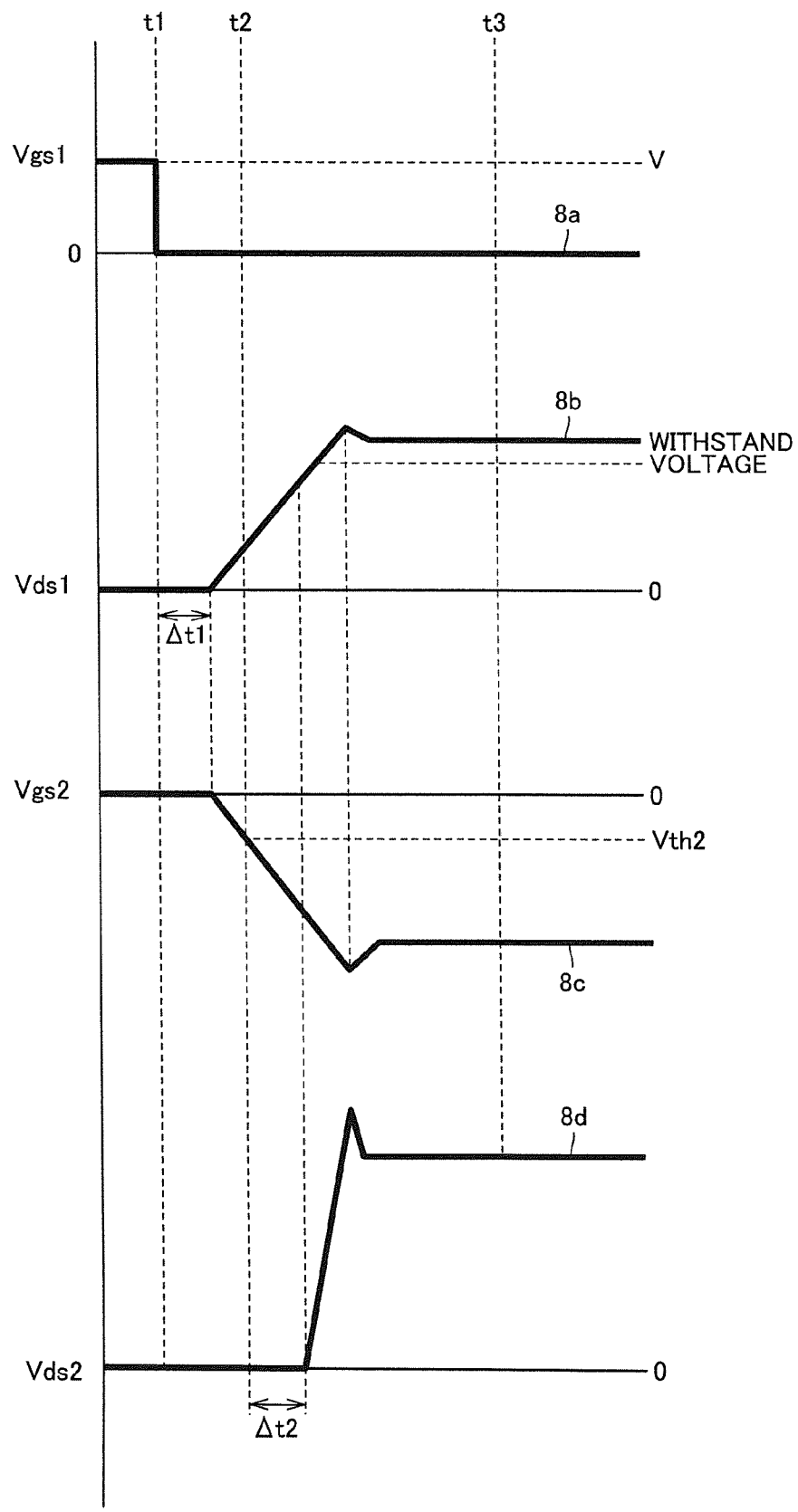
FIG. 8 is a waveform diagram illustrating temporal variations of a gate-source voltage and a drain-source voltage of each switching element included in the cascode circuit of FIG. 7 in a turn-off operation.

FIG. 6 is a circuit diagram illustrating a circuit configuration of a cascode circuit 4 according to the fourth embodiment of the present invention. Cascode circuit 4 illustrated in FIG. 6 is different from cascode circuit 3 according to the third embodiment in that it includes a clamp circuit 20 instead of clamp circuit 10. Clamp circuit 20 is equivalent to that included in cascode circuit 2 according to the second embodiment. The components that are equivalent to those cascode circuit 1 will be assigned with the same reference numerals and the detailed description thereof will not be repeated.

During the turn-off operation of cascode circuit 4, the temporal variations of the drain-source voltage or the like of each switching element are similar to those illustrated in FIG. 5, and thereby will be described with reference to FIG. 5 again. Since the timing where switching element Q2 starts the switching from the on state to the off state is the same as that in the first embodiment until timing (t2+Δt2), the detailed description thereof will not be repeated.

At timing t4, due to the current flowing through another path, drain-source voltage Vds1 of switching element Q1 exceeds power source voltage V by the voltage of ΔV, and the voltage of ΔV is a small voltage compared to power source voltage V. Accordingly, gate-source voltage Vgs2 of switching element Q2 increase from zero in the negative direction by the voltage of ΔV. The energy equivalent to the voltage of ΔV is temporarily stored in inductor L1, and then supplied to gate driving circuit 100. Diode D2 prevents the energy equivalent to the voltage of ΔV from flowing back to power source E.

At this time, drain-source voltage Vds1 of switching element Q1 and terminal-terminal voltage Vc1 of capacitor C1 are clamped not greater than the voltage of (V+ΔV). Therefore, drain-source voltage Vds1 of switching element Q1 is prevented from exceeding power source voltage V of gate driving circuit 100 excessively.

At timing t5, switching element Q1 and switching element Q2 has completed the turn-off operation, and both are at the off state. Since resistor R1 dissipates the energy stored in capacitor C1 and equivalent to the voltage of ΔV in accordance with a time constant (R1×C1), drain-source voltage Vds1 of switching element Q1 and terminal-terminal voltage Vc1 of capacitor C1 converge to power source voltage V, and gate-source voltage Vgs2 of switching element Q2 converges to zero.

As described above, similar to the third embodiment, it is possible for clamp circuit 20 to prevent switching element Q1 from being damaged in a turn-off operation. Moreover, since the energy equivalent to the voltage of ΔV is supplied to gate driving circuit 100 for its operation, there may be no power loss as that dissipated by resistor R1 as heat in the third embodiment. Therefore, the power loss can be further reduced.

The description has been carried out in the case where switching element Q1 is an FET and switching element Q2 is a power transistor, but they are not limited thereto. In the case where both switching element Q1 and switching element Q2 are an FET, as long as the withstand voltage of switching element Q2 is not lower than the withstand voltage required by the cascode circuit, the same effects can be obtained. Even in the case where switching element Q1 is a bipolar transistor, it can be handled in exactly the same way by associating the drain, the gate and the source with the collector, the base and the emitter, respectively.

The description has been carried out in the case where gate driving circuit 100 is provided with a signal source S, a gate driving element G, a resistor R and a capacitor C, and however, the present invention is applicable to any gate driving circuit irrespective of its circuit configuration as long as it is configured to receive the supply of a power source voltage V from a power source terminal P and output a gate driving signal to the gate of a switching element Q1.

It should be understood that the embodiments disclosed herein have been presented for the purpose of illustration and description but not limited in all aspects. It is intended that the scope of the present invention is not limited to the description above but defined by the scope of the claims and encompasses all modifications equivalent in meaning and scope to the claims.

REFERENCE SIGNS LIST

Q1, Q2: switching elements; 1, 2, 3, 4: cascode circuit; 10, 20: clamp circuit; 100: gate driving circuit; G: gate driving element; S: signal source; P: power source terminal; R, R1: resistor; C, C0, C1: capacitor; D1, D2: diode; L1: inductor; E: power source; V: power source voltage; P0, P1, P2: connection point; ΔV, (V+ΔV): voltage; Vc1: terminal-terminal voltage; Vds1, Vds2: drain-source voltage; Vgs1, Vgs2: gate-source voltage; Vth2: gate threshold voltage; 2a, 2b, 2c, 2d, 2e, 5a, 5b, 5c, 5d, 5e, 8a, 8b, 8c, 8d: waveform; t1, t2, t3, t4, t5, (t1+Δt1), (t2+Δt2): timing; Δt1, Δt2: delay time

The invention claimed is:

1. A cascode circuit, comprising:
a first switching element which is normally off by default; and
a second switching element having a source of said second switching element connected to a drain of said first switching element, and being caused to perform a normally-off operation by a gate driving circuit connected to a gate of said first switching element,
further including a clamp circuit which is provided between a power source terminal of said gate driving circuit and the drain of said first switching element, a power source being connected to said power source terminal, said power source being provided outside of said cascode circuit, said clamp circuit configured to clamp a voltage between the drain and the source of said switching elements to a power source voltage supplied from said power source when said gate driving circuit operates to turn off said first switching element and said second switching element wherein said second switching element is normally on by default, and a gate of said second switching element is connected to the source of said first switching element, said clamp circuit includes a first diode connected in series between the drain of said first switching element and said power source terminal in such a way that an anode of said first diode is connected to the drain of said first switching element, wherein said clamp circuit further includes:

a capacitor connected between a cathode of said first diode and a source of said first switching element;

an inductor connected between the cathode of said first diode and said power source terminal of said gate driving circuit; and a second diode connected in series between said power source and said power source terminal in such a way that a cathode of said second diode is connected to said power source terminal.

2. A cascode circuit, comprising:

a first switching element which is normally off by default; and a second switching element having a source of said second switching element connected to a drain of said first switching element, and being caused to perform a normally-off operation by a gate driving circuit connected to a gate of said first switching element, further including a clamp circuit which is provided between a power source terminal of said gate driving circuit and the drain of said first switching element, a power source being connected to said power source terminal, said power source being provided outside of said cascode circuit, said clamp circuit configured to clamp a voltage between the drain and the source of said switching elements to a power source voltage supplied from said power source when said gate driving circuit operates to turn off said first switching element and said second switching element, wherein said second switching element is normally off by default, and a gate of said second switching element is configured to receive said power source voltage supplied from said power source, said clamp circuit includes a first diode connected in series between the drain of said first switching element and said power source terminal in such a way that an anode of said first diode is connected to the drain of said first switching element, wherein said clamp circuit further includes:

a capacitor connected between a cathode of said first diode and a source of said first switching element;

an inductor connected between the cathode of said first diode and said power source terminal of said gate driving circuit; and a second diode connected in series between said power source and said power source terminal in such a way that a cathode of said second diode is connected to said power source terminal.

* * * * *